US012684933B2

(12) United States Patent (10) Patent No.: US 12,684,933 B2
Matsui et al. (45) Date of Patent: Jul. 14, 2026

(54) METHOD FOR MANUFACTURING SOLAR CELL

(71) Applicant: Panasonic Intellectual Property Management Co., Ltd., Osaka (JP)

(72) Inventors: Taisuke Matsui, Osaka (JP); Hiroshi Higuchi, Kyoto (JP); Kenji Kawano, Osaka (JP); Akio Matsushita, Osaka (JP); Takayuki Negami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 5 days.

(21) Appl. No.: 18/806,261

(22) Filed: Aug. 15, 2024

(65) Prior Publication Data

US 2024/0404763 A1 Dec. 5, 2024

Related U.S. Application Data

(63) Continuation of application No. 17/935,611, filed on Sep. 27, 2022, which is a continuation of application No. PCT/JP2021/016249, filed on Apr. 22, 2021.

(30) Foreign Application Priority Data

Apr. 27, 2020 (JP) ................................. 2020-078515

(51) Int. Cl.
*H10K 30/57* (2023.01)
*H01G 9/20* (2006.01)
(Continued)

(52) U.S. Cl.
CPC ........... *H10K 30/57* (2023.02); *H01G 9/2081* (2013.01); *H10K 85/50* (2023.02); *H10W 90/00* (2026.01);
(Continued)

(58) Field of Classification Search
CPC ........ H10K 30/57; H10K 85/50; H10K 30/10; H10K 30/15; H10K 30/88; H10K 2102/00;
(Continued)

(56) References Cited

U.S. PATENT DOCUMENTS

2002/0046766 A1 4/2002 Carlson et al.
2010/0229912 A1* 9/2010 Eo .......................... H10F 10/172
257/E31.043
(Continued)

FOREIGN PATENT DOCUMENTS

JP 1-146373 6/1989
JP 3-263880 11/1991
(Continued)

OTHER PUBLICATIONS

ZHAO ("Four-Terminal All-Perovskite Tandem Solar Cells Achieving Power Conversion Efficiencies Exceeding 23%") ACS Energy Letters 2018 3 (2), 305-306 (Year: 2018).*
(Continued)

*Primary Examiner* — Angelo Trivisonno
(74) *Attorney, Agent, or Firm* — Greenblum & Bernstein, P.L.C.

(57) ABSTRACT

Methods for manufacturing a solar cell that includes a first substrate, a first electrode layer, a first electron transport layer, a first photoelectric conversion layer, a first hole transport layer, a second electrode layer, a third electrode layer, a second electron transport layer, a second photoelectric conversion layer, a second hole transport layer, a fourth electrode layer, and a second substrate that are disposed in the order stated. The first photoelectric conversion layer includes a first perovskite compound, and the second photoelectric conversion layer includes a second perovskite
(Continued)

3compound. The first perovskite compound has a bandgap greater than a bandgap of the second perovskite compound.

11 Claims, 8 Drawing Sheets

(51) Int. Cl.

| | |
|---|---|
| *H10K 85/50* | (2023.01) |
| *H10W 90/00* | (2026.01) |
| *H10K 30/10* | (2023.01) |
| *H10K 30/15* | (2023.01) |
| *H10K 30/88* | (2023.01) |
| *H10K 102/00* | (2023.01) |

(52) U.S. Cl.
  CPC ........... *H01G 9/2077* (2013.01); *H10K 30/10* (2023.02); *H10K 30/15* (2023.02); *H10K 30/88* (2023.02); *H10K 2102/00* (2023.02); *H10W 90/752* (2026.01)

(58) Field of Classification Search
  CPC .. H01G 9/2081; H01G 9/2077; H01G 9/2009; H01G 9/2031; H01L 25/0657; H01L 2225/06506; Y02P 70/50; Y02B 10/10; Y02E 10/549
  See application file for complete search history.

(56) References Cited

U.S. PATENT DOCUMENTS

2018/0174761 A1     6/2018  Kamino et al.

2021/0143350 A1*    5/2021  Irwin .................... H10K 30/40

FOREIGN PATENT DOCUMENTS

| | | |
|---|---|---|
| JP | 2009-536455 | 10/2009 |
| JP | 2018-518845 | 7/2018 |

OTHER PUBLICATIONS

International Search Report of PCT application No. PCT/JP2021/016249 dated Jul. 6, 2021 along with translation thereof.
Renxing Lin et al., "Monolithic all-perovskite tandem solar cells with 24.8% efficiency exploiting comproportionation to suppress Sn(ii) oxidation in precursor ink", Nature Energy, vol. 4, 2019, pp. 864-873. [DOI: https://doi.org/10.1038/s41560-019-0466-3.
Julian Burschka et al., "Sequential deposition as a route to high-performance perovskite-sensitized solar cells", Nature, vol. 499, Jul. 18, 2013, pp. 316-319. [DOI: 10.1038/nature12340].
The EPC Office Action dated Sep. 20, 2023 for the related European Patent Application No. 21797247.0.
Correa-Baena Juan-Pablo et al: "Promise and challenges of perovskite solar cells", Science, vol. 358, No. 6364, Nov. 10, 2017 (Nov. 10, 2017), pp. 739-744, XP093080390.
Warren Emily L. et al: "A Taxonomy for Three-Terminal Tandem Solar Cells", ACS Energy Letters, vol. 5, No. 4, Mar. 23, 2020 (Mar. 23, 2020), pp. 1233-1242, XP093057522.
McMeekin et al., Joule 3, 387-401, "Solution-Processed All-Perovskite Multi-junction Solar Cells" (Year: 2019).
Todorov, "A road towards 25% efficiency and beyond: perovskite tandem solar cells", Mol. Syst. Des. Eng., 2016, 1, p. 370-376 (Year: 2016).

* cited by examiner

METHOD FOR MANUFACTURING SOLAR CELL

This application is a continuation of U.S. patent application Ser. No. 17/935,611, filed Sep. 27, 2022, which is a continuation of International Patent Application No. PCT/JP2021/016249, filed Apr. 22, 2021, which claims priority to Japanese Patent Application No. 2020-078515, filed Apr. 27, 2020. The entire contents of each of the above-mentioned documents is hereby incorporated by reference in its entirety.

BACKGROUND

1. Technical Field

The present disclosure relates to a solar cell, and methods for manufacturing a solar cell.

2. Description of the Related Art

In recent years, research and development of perovskite solar cells have been advanced to provide a new solar cell that can replace the existing silicon-based solar cell.

Perovskite solar cells use, as a photoelectric conversion material, a perovskite compound represented by a chemical formula of $ABX_3$, where A is a monovalent cation, B is a divalent cation, and X is a halogen anion.

Julian Burschka et al., "Sequential deposition as a route to high-performance perovskite-sensitized solar cells", Nature, vol. 499, pp. 316-319, 18 Jul. 2013 [DOI: 10.1038/nature 12340] discloses a perovskite solar cell that uses, as a photoelectric conversion material for the perovskite solar cell, a perovskite compound represented by a chemical formula of $CH_3NH_3PbI_3$ (hereinafter referred to as "MAPBI₃"). In the perovskite solar cell disclosed in Julian Burschka et al., the perovskite compound represented by $MAPbI_3$, $TiO_2$, and Spiro-OMeTAD are used as a photoelectric conversion material, an electron transport material, and a hole transport material, respectively.

"Monolithic all-perovskite tandem solar cells with 24.8% efficiency exploiting comproportionation to suppress Sn(ii) oxidation in precursor ink", Nature Energy, vol. 4, pp. 864-873, 2019 discloses a perovskite tandem solar cell. Perovskite tandem solar cells have a configuration in which multiple solar cells that use perovskite compounds are stacked together, with bandgaps of the perovskite compounds being different from each other. Perovskite tandem solar cells can improve photoelectric conversion efficiency.

SUMMARY

One non-limiting and exemplary embodiment provides a perovskite tandem solar cell that has high photoelectric conversion efficiency, without compromising industrial productivity.

In one general aspect, the techniques disclosed here feature a solar cell including a first substrate, a first electrode layer, a first electron transport layer, a first photoelectric conversion layer, a first hole transport layer, a second electrode layer, a third electrode layer, a second electron transport layer, a second photoelectric conversion layer, a second hole transport layer, a fourth electrode layer, and a second substrate that are disposed in the order stated. The first photoelectric conversion layer includes a first perovskite compound. The second photoelectric conversion layer includes a second perovskite compound. The first perovskite compound has a bandgap greater than a bandgap of the second perovskite compound.

The present disclosure provides a perovskite tandem solar cell that has high photoelectric conversion efficiency, without compromising industrial productivity.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Definitions of Terms

Figure 1A:
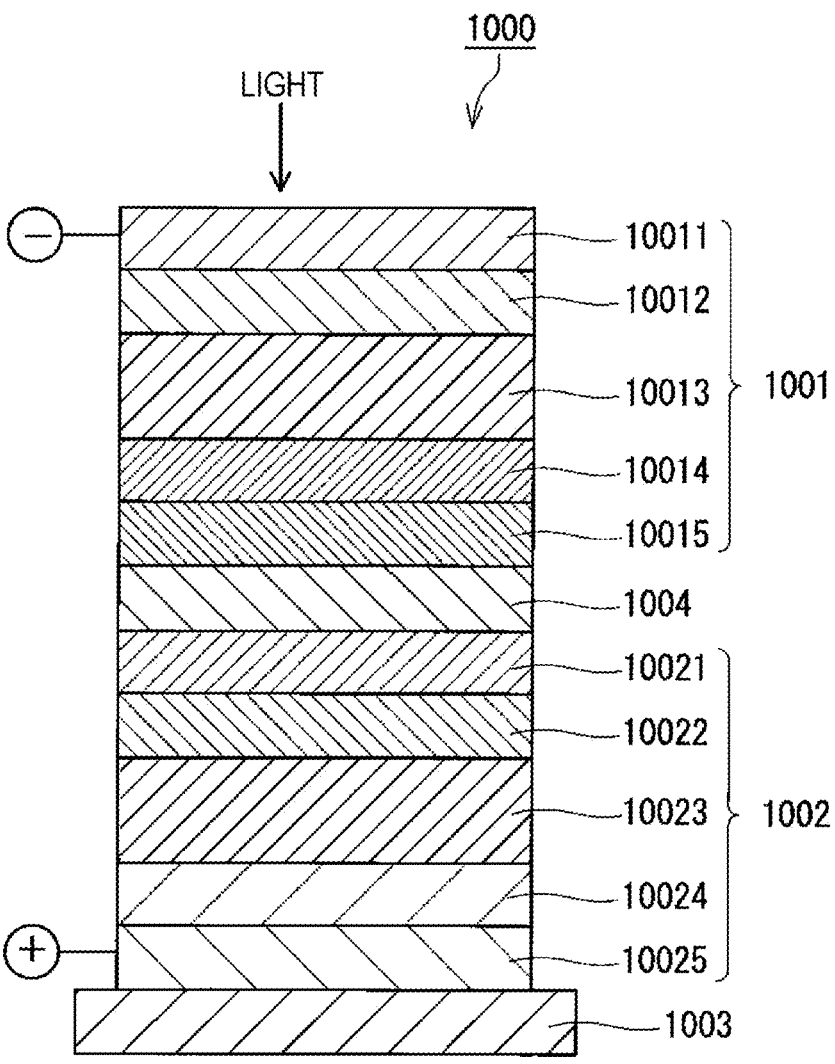
FIG. 1A is a schematic cross-sectional view of an example of a typical perovskite tandem solar cell having two terminals.

As used in this specification, the term "perovskite compound" means a perovskite crystal structure represented by a chemical formula of $ABX_3$, where A is a monovalent cation, B is a divalent cation, and X is a halogen anion, and also means a structure having a crystal similar to that of the perovskite crystal structure.

As used in this specification, the term "lead-type perovskite compound" means a perovskite compound containing a Pb cation as a divalent cation.

As used in this specification, the term "tin-lead-combined perovskite compound" means a perovskite compound containing both a Sn cation and a Pb cation as divalent cations.

As used in this specification, the term "perovskite solar cell" means a solar cell including a perovskite compound as a photoelectric conversion material.

As used in this specification, the term "lead-type perovskite solar cell" means a solar cell including a lead-type perovskite compound as a photoelectric conversion material.

As used in this specification, the term "perovskite tandem solar cell" means a stack-type solar cell having a configuration in which multiple solar cells that use perovskite compounds are stacked one above another, with bandgaps of the perovskite compounds being different from each other.

Underlying Knowledge Forming Basis of the Present Disclosure

Knowledge forming the basis of the present disclosure will be described below.

A perovskite tandem solar cell has a structure in which a top cell and a bottom cell are stacked. The top cell is disposed on a light incident surface-side, and the bottom cell is disposed on a side opposite to the light incident surface. Typically, the top cell is a perovskite solar cell including, as a photoelectric conversion material, a perovskite compound having a large bandgap. Typically, the bottom cell is a perovskite solar cell including, as a photoelectric conversion material, a perovskite compound having a bandgap smaller than the bandgap of the perovskite compound of the top cell. With this structure, the perovskite tandem solar cell effectively utilizes a broad range of light and, therefore, can improve conversion efficiency.

The top cell typically uses a lead-type perovskite compound as a photoelectric conversion material. It has been often reported that in the instance of solar cells that use a lead-type perovskite compound as a photoelectric conversion material, solar cells having an "n-i-p structure" have high photoelectric conversion efficiency. The "n-i-p structure" is a structure in which an electron transport layer, a photoelectric conversion layer, and a hole transport layer are disposed in the order stated from a position closest to a substrate. On the other hand, the bottom cell typically uses a tin-lead-combined perovskite compound as a photoelectric conversion material. It has been often reported that in the instance of solar cells that use a tin-lead-combined perovskite compound, solar cells having a "p-i-n structure" have high photoelectric conversion efficiency. The "p-i-n structure" is a structure in which a hole transport layer, a photoelectric conversion layer, and an electron transport layer are disposed in the order stated from a position closest to a substrate.

Regarding the relationships between the type of the perovskite compound used as a photoelectric conversion material and the structure with which high photoelectric conversion efficiency can be achieved, the reasons for the relationships are not clear. However, one possible reason is that the N-type materials that can be used are limited.

In the instance of the n-i-p structure, the N-type material is disposed on the substrate side. Accordingly, in the instance of the n-i-p structure, process limitations such as a limitation to a temperature during the layer formation are not imposed, but instead, it is required that the N-type material not dissolve when a perovskite compound is stacked on top of the N-type material. Accordingly, a metal oxide is typically used. Metal oxide-based N-type materials are believed to have good compatibility with lead-type perovskite compounds. Accordingly, it is believed that, generally, solar cells that use a lead-type perovskite compound can have high photoelectric conversion efficiency in instances in which the solar cells are provided with an n-i-p structure that uses a metal oxide-based N-type material.

On the other hand, in the instance of the p-i-n structure, the N-type material is disposed on top of the perovskite compound. Accordingly, in the instance of the p-i-n structure, it is required that the layer of the N-type material can be formed with a process that does not damage the perovskite compound. Accordingly, a fullerene-based material is typically used. Fullerene-based N-type materials are believed to have good compatibility with tin-lead-combined perovskite compounds. Accordingly, it is believed that, generally, solar cells that use a tin-lead-combined perovskite compound can have high photoelectric conversion efficiency in instances in which the solar cells are provided with a p-i-n structure that uses a fullerene-based N-type material.

However, regarding perovskite tandem solar cells, it is difficult to stack a top cell and a bottom cell together when the combination is a top cell having the n-i-p structure and a bottom cell having the p-i-n structure. In the instance of typical perovskite tandem solar cells, the top cell and the bottom cell are joined to each other via a recombination layer in which the recombination of electrons and holes occurs. In this instance, the top cell and the bottom cell are required to have the same structure, that is, the p-i-n structure or the n-i-p structure. That is, perovskite tandem solar cells are required to have a configuration as illustrated in FIG. 1A or FIG. 1B, for example.

Figure 1B:
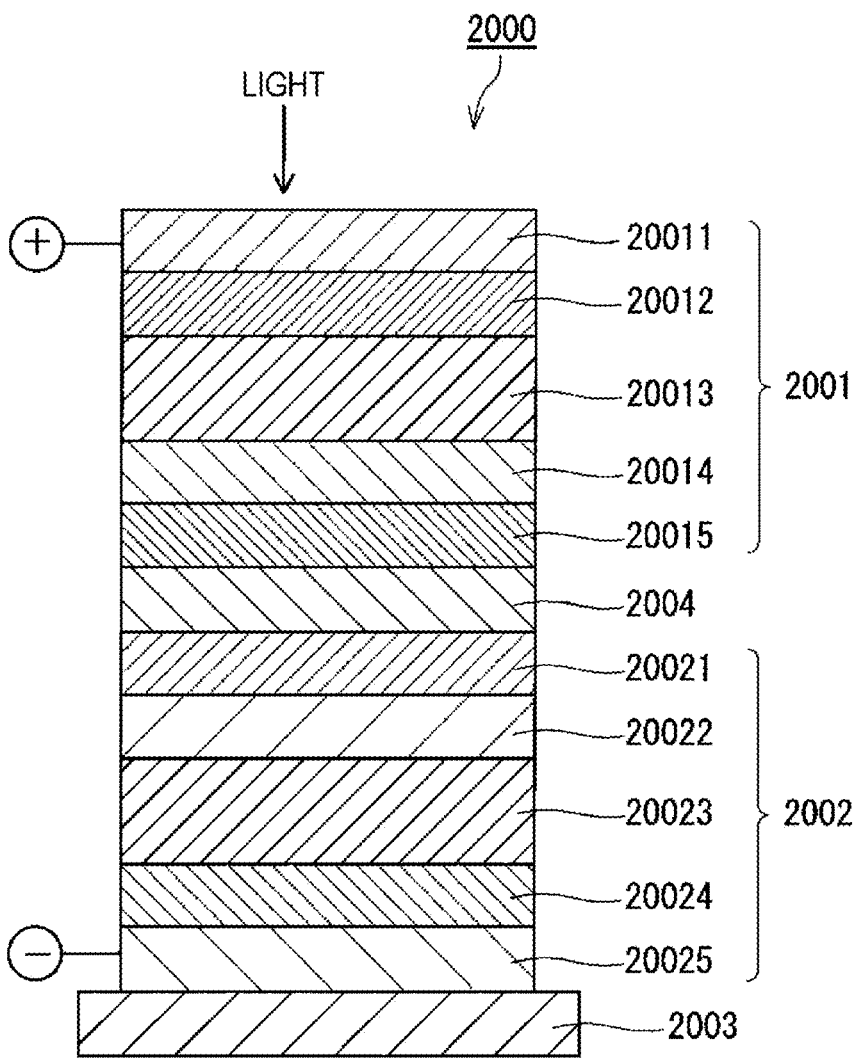
FIG. 1B is a schematic cross-sectional view of a modification of a typical perovskite tandem solar cell having two terminals.

FIG. 1A is a schematic cross-sectional view of an example of a typical perovskite tandem solar cell having two terminals. FIG. 1B is a schematic cross-sectional view of a modification of a typical perovskite tandem solar cell having two terminals. Hereinafter, a structure having two terminals will be referred to as a "two-terminal structure". A perovskite tandem solar cell 1000, illustrated in FIG. 1A, includes a top cell 1001 and a bottom cell 1002. The top cell 1001 has a p-i-n structure, and the bottom cell 1002 has a p-i-n structure. Specifically, the perovskite tandem solar cell 1000, which has a two-terminal structure, includes a bottom cell 1002, a recombination layer 1004, and a top cell 1001, which are disposed, in the order stated, on a substrate 1003. The top cell 1001 includes a first electrode layer 10011, a first electron transport layer 10012, a first photoelectric conversion layer 10013, a first hole transport layer 10014, and a second electrode layer 10015, which are disposed in order from a position closest to a light incident surface, that is, from an upper side as viewed in FIG. 1A. The bottom cell 1002 includes a third electrode layer 10021, a second electron transport layer 10022, a second photoelectric conversion layer 10023, a second hole transport layer 10024, and a fourth electrode layer 10025, which are disposed in order from a position closest to the light incident surface, that is, from an upper side as viewed in FIG. 1A. A perovskite tandem solar cell 2000, illustrated in FIG. 1B, includes a top cell 2001 and a bottom cell 2002. The top cell 2001 has an n-i-p structure, and the bottom cell 2002 has an n-i-p structure. Specifically, the perovskite tandem solar cell 2000 includes a bottom cell 2002, a recombination layer 2004, and a top cell 2001, which are disposed in the order stated on a substrate 2003. The top cell 2001 includes a first electrode layer 20011, a first hole transport layer 20012, a first photoelectric conversion layer 20013, a first electron transport layer 20014, and a second electrode layer 20015, which are disposed in order from a position closest to a light incident surface, that is, from an upper side as viewed in FIG. 1B. The bottom cell 2002 includes a third electrode layer 20021, a second hole transport layer 20022, a second photoelectric conversion layer 20023, a second electron transport layer 20024, and a fourth electrode layer 20025, which are disposed in order from a position closest to the light incident surface, that is, from an upper side as viewed in FIG. 1B.

The present inventors diligently performed studies and discovered a structure for a perovskite tandem solar cell that enables the top cell and the bottom cell to be structured so as to provide high photoelectric conversion efficiency.

EMBODIMENTS OF THE PRESENT DISCLOSURE

Embodiments of the present disclosure will now be described in detail with reference to the drawings.

First Embodiment

Figure 2:
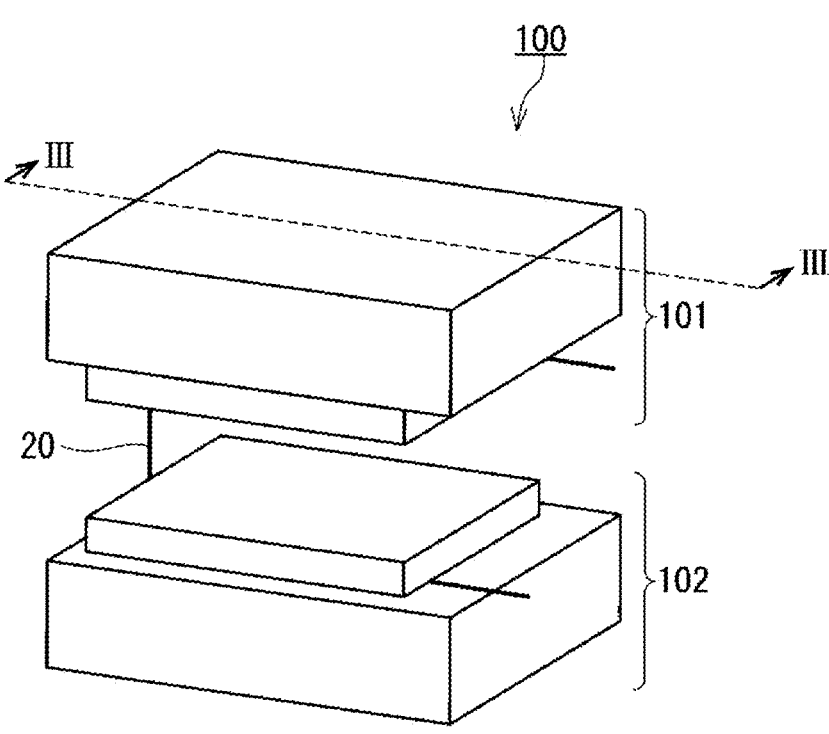
FIG. 2 is a perspective view of a perovskite tandem solar cell according to a first embodiment.
Figure 3:
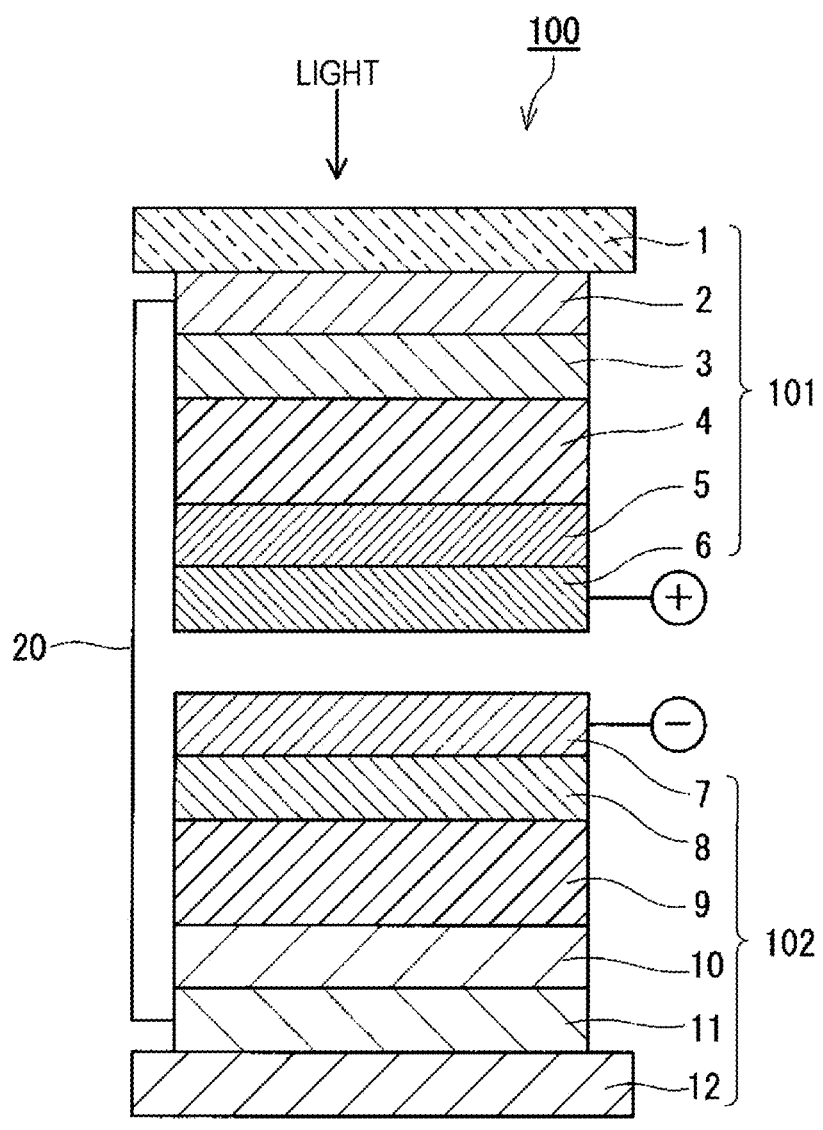
FIG. 3 is a cross-sectional view of the perovskite tandem solar cell illustrated in FIG. 2 taken along line III-III.

FIG. 2 is a perspective view of a perovskite tandem solar cell according to a first embodiment. FIG. 3 is a cross-sectional view of the perovskite tandem solar cell illustrated in FIG. 2 taken along line III-III.

As illustrated in FIGS. 2 and 3, a solar cell 100, according to the first embodiment, includes a top cell 101 and a bottom cell 102.

The top cell 101 includes a first substrate 1, a first electrode layer 2, a first electron transport layer 3, a first photoelectric conversion layer 4, a first hole transport layer 5, and a second electrode layer 6. In the top cell 101, the first substrate 1, the first electrode layer 2, the first electron transport layer 3, the first photoelectric conversion layer 4, the first hole transport layer 5, and the second electrode layer 6 are disposed in the order stated from a position closest to a light incident surface, that is, from an upper side as viewed in FIG. 3.

Note that in the top cell 101, for example, the first substrate 1, the first electrode layer 2, the first electron transport layer 3, the first photoelectric conversion layer 4, the first hole transport layer 5, and the second electrode layer 6, which are disposed in the order stated from a position closest to the light incident surface, are provided in a manner such that two adjacent layers are in contact with each other, as illustrated in FIG. 3. In other words, the first substrate 1 and the first electrode layer 2 may be disposed in contact with each other. The first electrode layer 2 and the first electron transport layer 3 may be disposed in contact with each other. The first electron transport layer 3 and the first photoelectric conversion layer 4 may be disposed in contact with each other. The first photoelectric conversion layer 4 and the first hole transport layer 5 may be disposed in contact with each other. The first hole transport layer 5 and the second electrode layer 6 may be disposed in contact with each other.

Note that one or more different layers may be appropriately provided between any of the layers that form the top cell 101. The one or more different layers may, for example, serve to inhibit recombination at interfaces between any of the layers or serve to bond the layers to each other. The one or more different layers will be described in the section "Different Layer", which will be presented later.

The bottom cell 102 includes a third electrode layer 7, a second electron transport layer 8, a second photoelectric conversion layer 9, a second hole transport layer 10, a fourth electrode layer 11, and a second substrate 12. In the bottom cell 102, the third electrode layer 7, the second electron transport layer 8, the second photoelectric conversion layer 9, the second hole transport layer 10, the fourth electrode layer 11, and the second substrate 12 are disposed in the order stated from a position closest to the light incident surface, that is, from an upper side as viewed in FIG. 3.

Note that in the bottom cell 102, for example, the third electrode layer 7, the second electron transport layer 8, the second photoelectric conversion layer 9, the second hole transport layer 10, the fourth electrode layer 11, and the second substrate 12, which are disposed in the order stated from a position closest to the light incident surface, are provided in a manner such that two adjacent layers are in contact with each other, as illustrated in FIG. 3. In other words, the third electrode layer 7 and the second electron transport layer 8 may be disposed in contact with each other. The second electron transport layer 8 and the second photoelectric conversion layer 9 may be disposed in contact with each other. The second photoelectric conversion layer 9 and the second hole transport layer 10 may be disposed in contact with each other. The second hole transport layer 10 and the fourth electrode layer 11 may be disposed in contact with each other. The fourth electrode layer 11 and the second substrate 12 may be disposed in contact with each other.

Note that one or more different layers may be appropriately provided between any of the layers that form the bottom cell 102. The one or more different layers may, for example, serve to inhibit recombination at interfaces between any of the layers or serve to bond the layers to each other.

In the solar cell 100, the first substrate 1, the first photoelectric conversion layer 4, the second photoelectric conversion layer 9, and the second substrate 12 are disposed in the order stated. In other words, the first photoelectric conversion layer 4 and the second photoelectric conversion layer 9 are disposed between the first substrate and the second substrate.

The solar cell 100 may have a four-terminal structure or a two-terminal structure. The solar cell 100 may have a two-terminal structure so that the routing of the electrode layers can be reduced. It can be said that the two-terminal structure is an industrially desirable structure compared with the four-terminal structure.

Note that in FIG. 3, the solar cell 100 has a two-terminal structure.

In the solar cell 100, the first electrode layer 2 and the fourth electrode layer 11 are electrically connected to each other. For example, the first electrode layer 2 and the fourth electrode layer 11 are connected to each other with a wire 20, as illustrated in FIG. 3. Note that the shape of the wire is not limited to a line shape provided that an electrical connection can be established. For example, the shape of the wire may be a planar shape.

In the solar cell 100, the second electrode layer 6 and the third electrode layer 7 are spaced apart from each other. The relative positions of the top cell 101 and the bottom cell 102 may be fixed to space the second electrode layer 6 apart from the third electrode layer 7. For example, a periphery of the first substrate 1 may be joined to a periphery of the second substrate 12 with a sealing member (not illustrated) to fix the relative positions of the top cell 101 and the bottom cell 102 so that the second electrode layer 6 and the third electrode layer 7 can be spaced apart from each other. "The second electrode layer 6 and the third electrode layer 7 are spaced apart from each other" means a state in which the second electrode layer 6 is not in direct contact with the third electrode layer 7. In the solar cell 100, the second electrode layer 6 and the third electrode layer 7 are spaced apart from each other and are not electrically connected to each other.

The top cell 101 of the solar cell 100 of the first embodiment has a structure in which the first electron transport layer 3, the first photoelectric conversion layer 4, and the first hole transport layer 5 are disposed in the order stated from a position closest to the first substrate 1. That is, the top cell 101 has the n-i-p structure. The top cell 101 includes a first perovskite compound that can be suitably used as a photoelectric conversion material. For example, the first perovskite compound includes a compound that enables high photoelectric conversion efficiency to be achieved with the n-i-p structure. Thus, the solar cell 100 of the first embodiment can be provided with the top cell 101 having a structure that enables high photoelectric conversion efficiency to be achieved.

The bottom cell 102 of the solar cell 100 of the first embodiment has a structure in which the second hole transport layer 10, the second photoelectric conversion layer 9, and the second electron transport layer 8 are disposed in the order stated from a position closest to the second substrate 12. That is, the bottom cell 102 has the p-i-n structure. The bottom cell 102 includes a second perovskite compound that can be suitably used as a photoelectric conversion material. For example, the second perovskite compound includes a compound that enables high photoelectric conversion efficiency to be achieved with the p-i-n structure. Thus, the solar cell 100 of the first embodiment can be provided with the bottom cell 102 having a structure that enables high photoelectric conversion efficiency to be achieved.

The electricity generated in the solar cell 100 can be drawn from the second electrode layer 6 and the third electrode layer 7 to an external circuit via, for example, respective wires connected to the second electrode layer 6 and the third electrode layer 7. That is, the top cell 101 and the bottom cell 102 are electrically connected to each other in series in the solar cell 100.

Since the solar cell 100 has the configuration described above, the solar cell 100 can be provided with a two-terminal structure, which is an industrially desirable structure. The space between the second electrode layer 6 and the third electrode layer 7, which are spaced apart from each other, is filled with air, for example.

The first photoelectric conversion layer 4 includes the first perovskite compound. The second photoelectric conversion layer 9 includes the second perovskite compound. Details of the first perovskite compound and the second perovskite compound will be described in the sections "First Photoelectric Conversion Layer 4" and "Second Photoelectric Conversion Layer 9", which will be presented later. It should be noted that the first perovskite compound has a bandgap greater than a bandgap of the second perovskite compound. Accordingly, the first photoelectric conversion layer 4 absorbs short-wavelength light. As referred to herein, the "short-wavelength light" means light having wavelengths of 450 nm to 550 nm, for example. The second photoelectric conversion layer 9 absorbs long-wavelength light. As referred to herein, the "long-wavelength light" means light having wavelengths of 600 nm to 780 nm, for example. With this configuration, the solar cell 100 can absorb light efficiently.

With the configuration described above, the solar cell 100 of the first embodiment can have high photoelectric conversion efficiency, without compromising industrial productivity.

Second Embodiment

Figure 4:
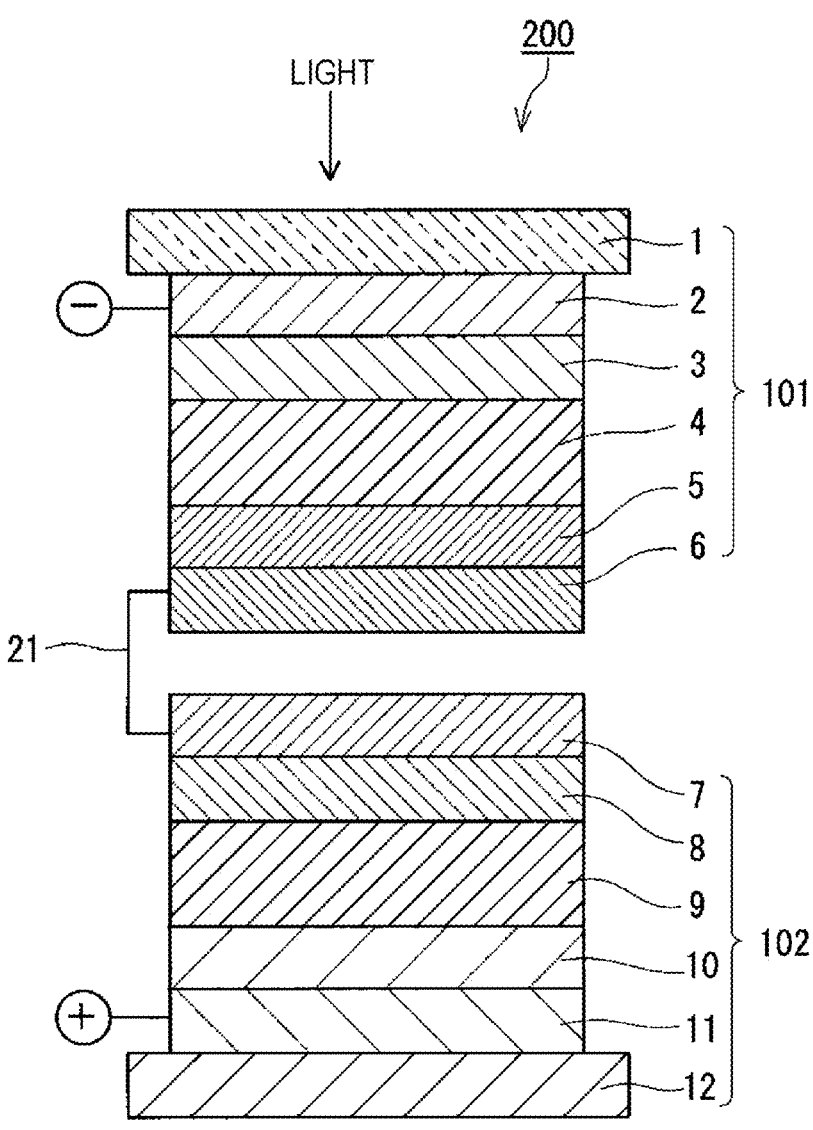
FIG. 4 is a schematic cross-sectional view of a perovskite tandem solar cell according to a second embodiment.

FIG. 4 is a schematic cross-sectional view of a perovskite tandem solar cell according to a second embodiment. A solar cell 200, according to the second embodiment, is different from the solar cell 100 of the first embodiment in the manner of electrically connecting the top cell 101 to the bottom cell 102. Note that in FIG. 4, the solar cell 200 has a two-terminal structure.

In the solar cell 200 of the second embodiment, the top cell 101 is electrically connected to the bottom cell 102 via an electrical connection between the second electrode layer 6 and the third electrode layer 7. For example, the second electrode layer 6 and the third electrode layer 7 are connected to each other with a wire 21, as illustrated in FIG. 4. Note that the shape of the wire is not limited to a line shape provided that an electrical connection can be established. For example, the shape of the wire may be a planar shape. Note that the second electrode layer 6 and the third electrode layer 7 are spaced apart from each other and are not in direct contact with each other.

The electricity generated in the solar cell 200 can be drawn from the first electrode layer 2 and the fourth electrode layer 11 to an external circuit via, for example, respective wires connected to the first electrode layer 2 and the fourth electrode layer 11. That is, the top cell 101 and the bottom cell 102 are electrically connected to each other in series in the solar cell 200.

Since the solar cell 200 has the configuration described above, the solar cell 200 can be provided with a two-terminal structure.

The solar cell 200 of the second embodiment has a configuration similar to that of the solar cell 100 of the first embodiment except for the difference in the electrical connection between the top cell 101 and the bottom cell 102.

With the configuration described above, the solar cell 200 of the second embodiment can have high photoelectric conversion efficiency, without compromising industrial productivity.

Third Embodiment

Figure 5:
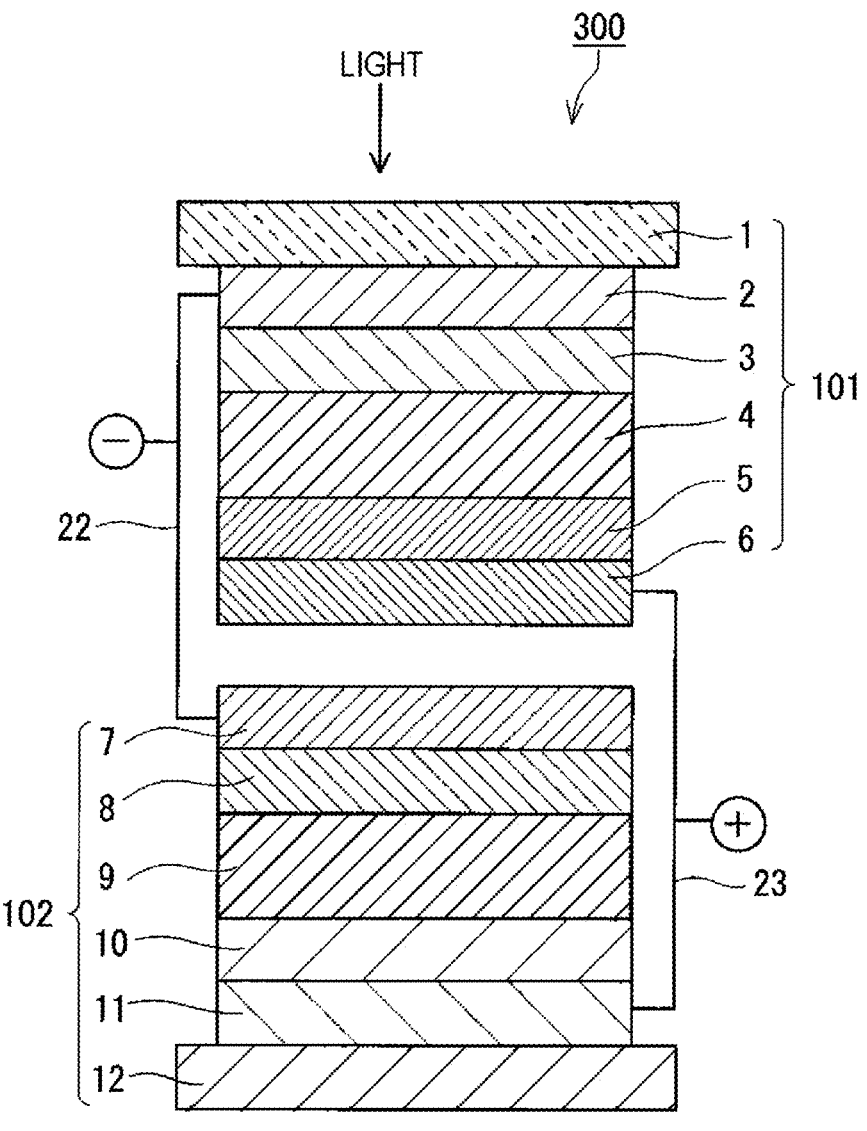
FIG. 5 is a schematic cross-sectional view of a perovskite tandem solar cell according to a third embodiment.

FIG. 5 illustrates a solar cell 300, according to a third embodiment. The solar cell 300 of the third embodiment is different from the solar cell 100 of the first embodiment in the manner of electrically connecting the top cell 101 to the bottom cell 102. Note that in FIG. 5, the solar cell 300 has a two-terminal structure.

In the solar cell 300 of the third embodiment, the top cell 101 and the bottom cell 102 are electrically connected to each other in parallel. As illustrated in FIG. 5, the first electrode layer 2 and the third electrode layer 7 are electrically connected to each other, and the second electrode layer 6 and the fourth electrode layer 11 are electrically connected to each other. The first electrode layer 2 and the third electrode layer 7 are electrically connected to each other via a first wire 22, for example. The second electrode layer 6 and the fourth electrode layer 11 are electrically connected to each other via a second wire 23, for example. Electricity is drawn to an external circuit via the first wire 22 and the second wire 23.

Since the solar cell 300 has the configuration described above, the solar cell 300 can be provided with a two-terminal structure. Furthermore, in the solar cell 300, the electrical parallel connection between the top cell 101 and the bottom cell 102 produces an effect of stabilizing the photoelectric conversion efficiency in an environment that tends to have variations in the current.

The solar cell 300 of the third embodiment has a configuration similar to that of the solar cell 100 of the first embodiment except for the difference in the electrical connection between the top cell 101 and the bottom cell 102.

With the configuration described above, the solar cell 300 of the third embodiment can have high photoelectric conversion efficiency, without compromising industrial productivity.

Fourth Embodiment

Figure 6:
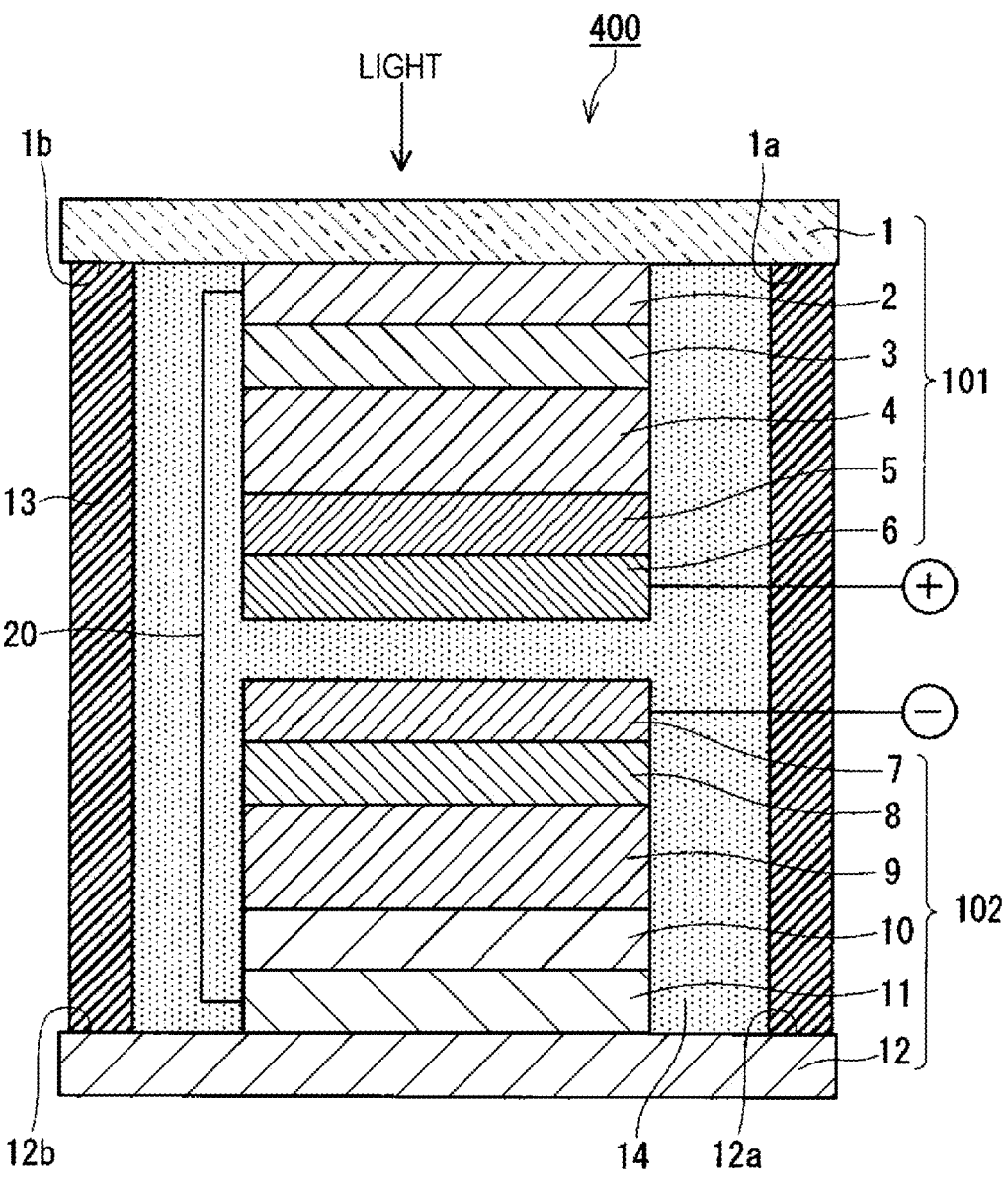
FIG. 6 is a schematic cross-sectional view of a perovskite tandem solar cell according to a fourth embodiment.

FIG. 6 is a schematic cross-sectional view of a perovskite tandem solar cell according to a fourth embodiment. A solar cell 400, according to the fourth embodiment, is different from the solar cell 100 of the first embodiment in that a periphery of the first substrate 1 and a periphery of the second substrate 12 are joined to each other with a sealing member 13, and a filler 14 is provided between the second electrode layer 6 and the third electrode layer 7. Note that in FIG. 6, the solar cell 400 has a two-terminal structure.

In the solar cell 400 of the fourth embodiment, as illustrated in FIG. 6, since the sealing member 13 is provided, the relative positions of the top cell 101 and the bottom cell 102 are fixed so that, for example, the second electrode layer 6 and the third electrode layer 7 can be spaced apart from each other. In the solar cell 400, the space surrounded by the first substrate 1, the second substrate 12, and the sealing member 13 is sealed, for example. As illustrated in FIG. 6, the top cell 101 and the bottom cell 102 may be housed in the space, and a region surrounding the top cell 101 and the bottom cell 102 may be filled with the filler 14.

For example, the sealing member 13 may be formed of a resin material, such as a UV-curable resin or a thermosetting resin, or a rubber material, such as butyl rubber.

For example, the filler 14 may include at least one selected from the group consisting of epoxy resins, silicone resins, and polyolefin-based resins. In the instance where the space between the second electrode layer 6 and the third electrode layer 7 is filled with the filler 14, a refractive index between the second electrode layer 6 and the third electrode layer 7 increases. As a result, reflection of incident light can be inhibited.

In FIG. 6, the solar cell 400 of the fourth embodiment is illustrated as being provided with the sealing member 13. However, the sealing member 13 need not be provided. For example, in instances where the filler 14 can also serve as a sealing agent, the positions of the top cell 101 and the bottom cell 102 can be fixed with the sealing agent so that the second electrode layer 6 and the third electrode layer 7 can be spaced apart from each other.

As illustrated in FIG. 6, in the solar cell 400 of the fourth embodiment, the top cell 101 is electrically connected to the bottom cell 102 in series via an electrical connection between the first electrode layer 2 and the fourth electrode layer 11. Alternatively, the top cell 101 may be electrically connected to the bottom cell 102 in series via an electrical connection between the second electrode layer 6 and the third electrode layer 7. Further alternatively, the top cell 101 may be electrically connected to the bottom cell 102 in parallel as in the solar cell 300 of the third embodiment.

Figure 7:
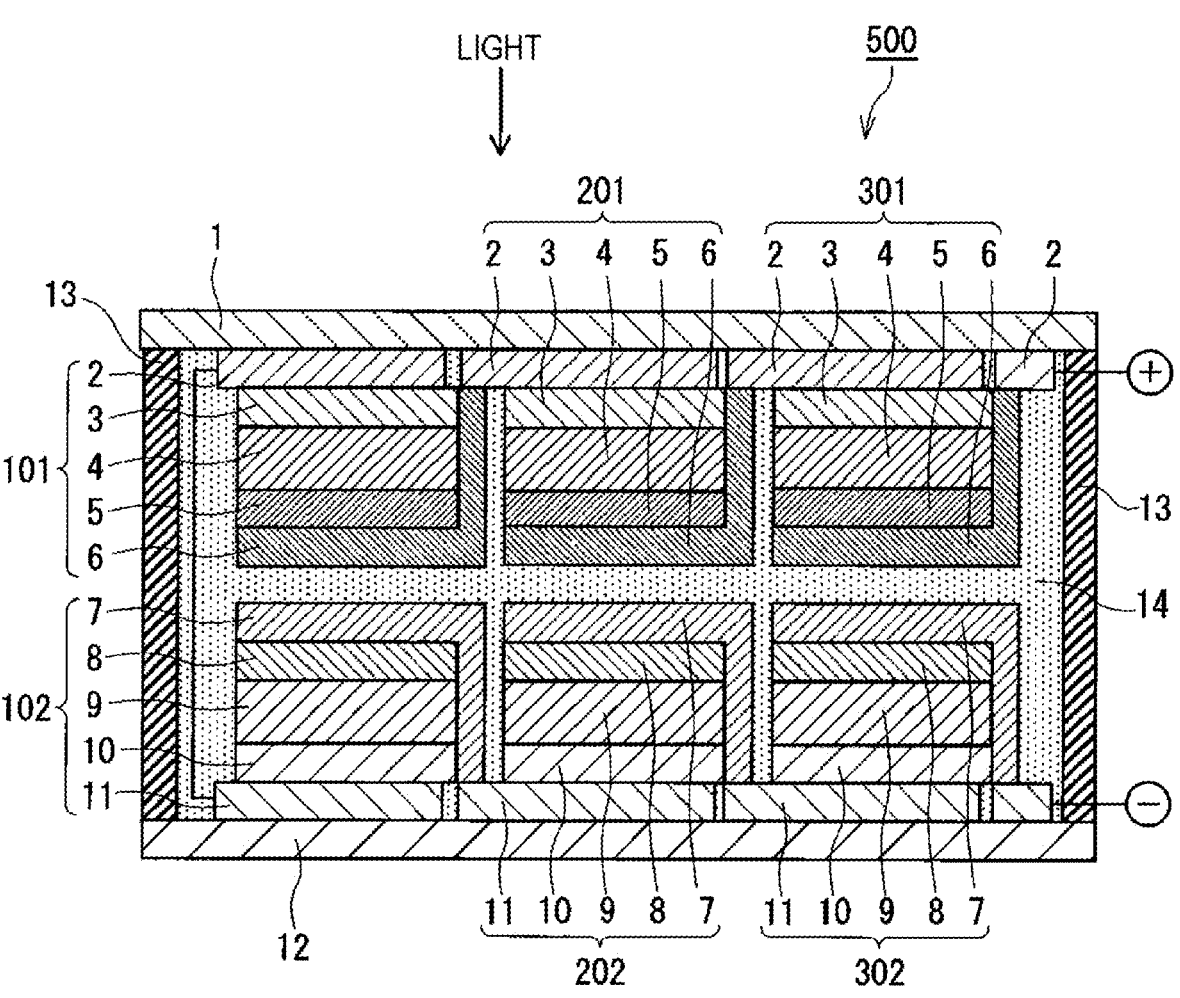
FIG. 7 is a schematic cross-sectional view of an example of a solar cell module including the perovskite tandem solar cells of the fourth embodiment.

For example, a solar cell module can be formed by connecting multiple solar cells 400 to one another. FIG. 7 is a schematic cross-sectional view of an example of a solar cell module including the perovskite tandem solar cells of the fourth embodiment.

A solar cell module 500, illustrated in FIG. 7, includes a top cell 101 (i.e., a first top cell 101), a second top cell 201, a third top cell 301, a bottom cell 102 (i.e., a first bottom cell 102), a second bottom cell 202, and a third bottom cell 302. The first top cell 101 and the first bottom cell 102 have the same configuration as that in the solar cell 400 illustrated in FIG. 6. Note that in FIG. 7, the solar cell module 500 has a two-terminal structure.

The first top cell 101, the second top cell 201, and the third top cell 301 are disposed on a light incident surface-side in the solar cell module 500. The second electrode layer 6 of the first top cell 101 is electrically connected to the first electrode layer 2 of the second top cell 201, which is disposed next to the first top cell 101. The second electrode layer 6 of the second top cell 201 is electrically connected to the first electrode layer 2 of the third top cell 301, which is disposed next to the second top cell 201. The first bottom cell 102, the second bottom cell 202, and the third bottom cell 302 are disposed on a side opposite to the light incident surface in the solar cell module 500. The third electrode layer 7 of the first bottom cell 102 is electrically connected to the fourth electrode layer 11 of the second bottom cell

202, which is disposed next to the first bottom cell 102. The third electrode layer 7 of the second bottom cell 202 is electrically connected to the fourth electrode layer 11 of the third bottom cell 302, which is disposed next to the second bottom cell 202. That is, the first top cell 101, the second top cell 201, the third top cell 301, the first bottom cell 102, the second bottom cell 202, and the third bottom cell 302 are electrically connected together in series in the solar cell module 500. The electricity generated in the solar cell module 500 can be drawn from the second electrode layer 6 of the third top cell 301 and the third electrode layer 7 of the third bottom cell 302 to an external circuit via, for example, respective wires connected to the second electrode layer 6 and the third electrode layer 7. In the solar cell module 500 illustrated in FIG. 7, the first top cell 101 and the first bottom cell 102 have a configuration in which the first electrode layer 2 and the fourth electrode layer 11 are electrically connected to each other. Furthermore, in the solar cell module 500, the second top cell 201 and the second bottom cell 202 have a configuration in which the first electrode layer 2 and the fourth electrode layer 11 are electrically connected to each other via the first cells (i.e., the first top cell 101 and the first bottom cell 102). Furthermore, in the solar cell module 500, the third top cell 301 and the third bottom cell 302 have a configuration in which the first electrode layer 2 and the fourth electrode layer 11 are electrically connected to each other via the first cells and the second cells (i.e., the second top cell 201 and the second bottom cell 202).

Note that the solar cell module 500 presented in the present embodiment has the configuration including three top cells and three bottom cells; however, the number of the cells is not limited to this.

Now, the layers will be described in detail.

First Substrate 1

The first substrate 1 supports the layers of the top cell 101. The first substrate 1 may be formed of a transparent material. For example, a glass substrate or a plastic substrate (which may be a plastic film) may be used. In instances where the first electrode layer 2 has sufficient strength, the first electrode layer 2 can support the layers, and, therefore, in such instances, the first electrode layer 2 may double as the first substrate 1. In other words, a first electrode layer 2 that can also serve as the first substrate 1 may be used.

First Electrode Layer 2

The first electrode layer 2 is conductive. Furthermore, the first electrode layer 2 is light-transmissive. For example, the first electrode layer 2 transmits therethrough light in a visible to near-infrared range. For example, the first electrode layer 2 may be formed of a metal oxide that is transparent and conductive. Examples of the metal oxide include the following metal oxides:

(i) indium-tin complex oxides;

(ii) tin oxide doped with antimony;

(iii) tin oxide doped with fluorine;

(iv) zinc oxide doped with at least one selected from the group consisting of boron, aluminum, gallium, and indium; and (v) composites of any of these.

The first electrode layer 2 may be formed of a non-transparent material, for which a pattern through which light can pass may be provided. Examples of the pattern through which light can pass include linear patterns, wavy patterns, grid-like patterns, and perforated metal-like patterns having a large number of fine through-holes regularly or irregularly arranged therein. When the first electrode layer 2 has any of these patterns, light can pass through the portion in which the material of the electrode layer is absent. Examples of the non-transparent material include platinum, gold, silver, copper, aluminum, rhodium, indium, titanium, iron, nickel, tin, zinc, and alloys containing any of these. The non-transparent material may be a conductive carbon material.

The first electrode layer 2 may have a light transmittance of, for example, greater than or equal to 50% or greater than or equal to 80%. A wavelength of the light to which the first electrode layer 2 should be transmissive depends on absorption wavelengths of the first photoelectric conversion layer 4 and the second photoelectric conversion layer 9. The first electrode layer 2 has a thickness of, for example, greater than or equal to 1 nm and less than or equal to 1000 nm.

First Electron Transport Layer 3

The first electron transport layer 3 transports electrons. The first electron transport layer 3 includes a semiconductor. It is desirable that the first electron transport layer 3 be formed of a semiconductor having a bandgap of greater than or equal to 3.0 eV. In instances where the first electron transport layer 3 is formed of a semiconductor having a bandgap of greater than or equal to 3.0 eV, visible light and infrared light can be transmitted therethrough to the first photoelectric conversion layer 4. Examples of the semiconductor include organic or inorganic n-type semiconductors.

Examples of the organic n-type semiconductors include imide compounds, quinone compounds, fullerenes, and derivatives of fullerenes. Examples of the inorganic n-type semiconductors include metal oxides, metal nitrides, and perovskite oxides. Examples of the metal oxides include oxides of Cd, Zn, In, Pb, Mo, W, Sb, Bi, Cu, Hg, Ti, Ag, Mn, Fe, V, Sn, Zr, Sr, Ga, Si, or Cr. A metal oxide including, as a major component, at least one selected from the group consisting of titanium oxide and tin oxide is desirable. As stated herein, "a metal oxide including, as a major component, at least one selected from the group consisting of titanium oxide and tin oxide" means that the metal oxide that is included in the first electron transport layer 3 includes titanium oxide and tin oxide in a total amount of greater than or equal to 50 mol %. It is desirable that the metal oxide be $TiO_2$. Examples of the metal nitrides include GaN. Examples of the perovskite oxides include $SrTiO_3$, $CaTiO_3$, and $ZnTiO_3$.

The first electron transport layer 3 may be formed of a material having a bandgap of greater than 6.0 eV. Examples of the material having a bandgap of greater than 6.0 eV include the following materials:

(i) halides of an alkali metal or an alkaline earth metal, such as lithium fluoride and barium fluoride; and (ii) oxides of an alkaline earth metal, such as magnesium oxide.

In this instance, the first electron transport layer 3 may have a thickness of, for example, less than or equal to 10 nm so that an electron transport property of the first electron transport layer 3 can be ensured.

The first electron transport layer 3 may include two or more layers, and the materials of the layers may be different from each other.

First Photoelectric Conversion Layer 4

The first photoelectric conversion layer 4 includes the first perovskite compound. Specifically, the first photoelectric conversion layer 4 includes the first perovskite compound, which serves as a photoelectric conversion material and is formed of a monovalent cation, a divalent cation, and a halogen anion. The photoelectric conversion material is a light-absorbing material.

In the present embodiments, the first perovskite compound may be a compound represented by a chemical formula of $A1B1X1_3$, where A1 is a monovalent cation, B1 is a divalent cation, and X1 is a halogen anion.

In this specification, A1, B1, and X1 are also referred to as an "A1 site", a "B1 site", and an "X1 site", respectively, in accordance with expressions commonly used for perovskite compounds.

In the present embodiments, the first perovskite compound may have a perovskite-type crystal structure represented by the chemical formula of $A1B1X1_3$. For example, a monovalent cation is located at the A1 site, a divalent cation is located at the B1 site, and a halogen anion is located at the X1 site.

A1 Site

The monovalent cation located at the A1 site is not limited. Examples of the monovalent cation include organic cations and alkali metal cations. Examples of the organic cations include methyl ammonium cations (i.e., $CH_3NH_3{}^+$), formamidinium cations (i.e., $NH_2CHNH_2{}^+$), phenylethyl ammonium cations (i.e., $C_6H_5C_2H_4NH_3{}^+$), and guanidinium cations (i.e., $CH_6N_3{}^+$). Examples of the alkali metal cations include cesium cations (i.e., $Cs^+$).

For example, the A1 site may include at least one selected from the group consisting of $Cs^+$, formamidinium cations, and methyl ammonium cations so that high photoelectric conversion efficiency can be achieved.

The cation that forms the A1 site may be a mixture of a plurality of the above-mentioned organic cations. The cation that forms the A1 site may be a mixture of at least one of the above-mentioned organic cations and at least one of the metal cations.

B1 Site

The divalent cation located at the B1 site is not limited. Examples of the divalent cation include divalent cations of the elements of Groups 13 to 15. For example, the B1 site includes a Pb cation, that is, $Pb^{2+}$.

X1 Site

The halogen anion located at the X1 site is not limited.

The element, that is, the ion, located at each of the A1, B1, and X1 sites may be two or more types of ions or one type of ion.

Specific examples of the first perovskite compound include $CH_3NH_3PbI_3$, $CH_3CH_2NH_3PbI_3$, $HC(NH_2)_2PbI_3$, $CH_3NH_3PbBr_3$, $CH_3NH_3Cl_3$, $CsPbI_3$, and $CsPbBr_3$.

The first photoelectric conversion layer 4 may include a material other than a photoelectric conversion material. For example, the first photoelectric conversion layer 4 may further include a quencher substance for reducing a defect density of the first perovskite compound. The quencher substance is a fluorine compound, such as stannous fluoride. A molar ratio of the quencher substance to the photoelectric conversion material may be greater than or equal to 5% and less than or equal to 20%.

The first photoelectric conversion layer 4 may primarily include the first perovskite compound formed of a monovalent cation, a divalent cation, and a halogen anion.

The statement "the first photoelectric conversion layer 4 primarily includes the first perovskite compound formed of a monovalent cation, a divalent cation, and a halogen anion" means that the first photoelectric conversion layer 4 includes the first perovskite compound formed of a monovalent cation, a divalent cation, and a halogen anion in an amount greater than or equal to 70 mass % (desirably greater than or equal to 80 mass %).

The first photoelectric conversion layer 4 may include impurities. The first photoelectric conversion layer 4 may further include a compound other than the first perovskite compound.

The first photoelectric conversion layer 4 may have a thickness of, for example, approximately greater than or equal to 100 nm and less than or equal to 2000 nm. The first perovskite compound that is included in the first photoelectric conversion layer 4 may be formed by using a coating process that uses a solution, a co-deposition process, or the like.

Furthermore, the first photoelectric conversion layer 4 may be in a form in which the first photoelectric conversion layer 4 partially coexists with the first electron transport layer 3 and the first hole transport layer 5, which will be described later, or in a form in which the first photoelectric conversion layer 4 has large-area interfaces with the first electron transport layer 3 and the first hole transport layer 5 in the film.

The top cell 101 needs to transmit therethrough long-wavelength light to the bottom cell 102. In other words, the top cell 101 is required to absorb short-wavelength light. Accordingly, the first perovskite compound that is included in the first photoelectric conversion layer 4 has a bandgap greater than a bandgap of the second perovskite compound that is included in the second photoelectric conversion layer 9.

First Hole Transport Layer 5

The first hole transport layer 5 includes a hole transport material. The hole transport material is a material that transports holes. Examples of the hole transport material include organic matter and inorganic semiconductors.

Examples of typical organic matter that can be used as the hole transport material include phenyl amines containing a tertiary amine in the backbone or triphenylamine derivatives; and compounds containing a thiophene structure, such as poly(3,4-ethylenedioxythiophene) (hereinafter referred to as "PEDOT"). The organic matter may be a polymer, with a molecular weight thereof not being particularly limited. Specific examples of typical organic matter that can be used as the hole transport material include 2,2',7,7'-tetrakis-(N, N-di-p-methoxyphenylamine)-9,9'-spirobifluorene (hereinafter referred to as "spiro-OMeTAD"), poly[bis(4-phenyl) (2,4,6-trimethylphenyl)amine](hereinafter referred to as "PTAA"), poly(3-hexylthiophene-2,5-diyl) (hereinafter referred to as "P3HT"), poly(3,4-ethylenedioxythiophene) polystyrene sulfonate (hereinafter referred to as "PEDOT: PSS"), and copper phthalocyanine (hereinafter referred to as "CuPc").

The inorganic semiconductor is a p-type semiconductor. Examples of the inorganic semiconductor include CuO, $Cu_2O$, CuSCN, and nickel oxide.

The first hole transport layer 5 may include two or more layers, and the materials of the layers may be different from each other.

Desirably, the first hole transport layer 5 has a thickness of greater than or equal to 1 nm and less than or equal to 1000 nm. The thickness is more desirably greater than or equal to 10 nm and less than or equal to 500 nm and even more desirably greater than or equal to 10 nm and less than or equal to 50 nm. When the thickness of the first hole transport layer 5 is greater than or equal to 1 nm and less than or equal to 1000 nm, a sufficient hole transport property can be exhibited. In addition, when the thickness of the first hole transport layer 5 is greater than or equal to 1 nm and less than or equal to 1000 nm, the first hole transport layer 5 has a low resistance, which results in highly efficient conversion of light to electricity.

The film can be formed by using any of various coating processes and printing processes known in the art. Examples of the coating processes include doctor blade processes, bar coating processes, spraying processes, dip coating processes, and spin coating processes. Examples of the printing processes include screen printing processes.

The first hole transport layer 5 may include a supporting electrolyte and a solvent. The supporting electrolyte and the solvent have an effect of stabilizing the holes in the first hole transport layer 5, for example.

Examples of the supporting electrolyte include ammonium salts and alkali metal salts. Examples of the ammonium salts include tetrabutylammonium perchlorate, tetraethylammonium hexafluorophosphate, imidazolium salts, and pyridinium salts. Examples of the alkali metal salts include lithium perchlorate and potassium tetrafluoroborate.

The solvent that is included in the first hole transport layer 5 may have high ionic conductivity. The solvent may be an aqueous solvent or an organic solvent. From the standpoint of stabilizing the solute, it is desirable that the solvent be an organic solvent. Examples of the organic solvent include heterocyclic compounds, such as tert-butylpyridine (hereinafter referred to as "t-BP"), pyridine, and N-methylpyrrolidone.

The solvent that is included in the first hole transport layer 5 may be an ionic liquid. The ionic liquid may be used alone or may be mixed with another solvent to be used. Ionic liquids are desirable because of their low volatility and high flame retardancy.

Examples of the ionic liquid include imidazolium compounds, such as 1-ethyl-3-methylimidazolium tetracyanoborate, pyridine compounds, cycloaliphatic amine compounds, aliphatic amine compounds, and azonium amine compounds.

Second Electrode Layer 6 and Third Electrode Layer 7

The second electrode layer 6 and the third electrode layer 7 are conductive. Furthermore, the second electrode layer 6 and the third electrode layer 7 are light-transmissive. For example, the second electrode layer 6 and the third electrode layer 7 transmit therethrough light in a visible to near-infrared range. For example, the second electrode layer 6 and the third electrode layer 7 may be formed of a metal oxide that is transparent and conductive. Examples of the metal oxide include the following metal oxides:

(i) indium-tin complex oxides;

(ii) tin oxide doped with antimony;

(iii) tin oxide doped with fluorine;

(iv) zinc oxide doped with at least one of boron, aluminum, gallium, and indium; and (v) composites of any of these.

The second electrode layer 6 and the third electrode layer 7 may be formed of a non-transparent material, for which a pattern through which light can pass may be provided. Examples of the pattern through which light can pass include linear patterns, wavy patterns, grid-like patterns, and perforated metal-like patterns having a large number of fine through-holes regularly or irregularly arranged therein. When the second electrode layer 6 and the third electrode layer 7 have any of these patterns, light can pass through the portion in which the material of the electrode layer is absent. Examples of the non-transparent material include platinum, gold, silver, copper, aluminum, rhodium, indium, titanium, iron, nickel, tin, zinc, and alloys containing any of these. The non-transparent material may be a conductive carbon material.

The second electrode layer 6 and the third electrode layer 7 may have a light transmittance of, for example, greater than or equal to 50% or greater than or equal to 80%. A wavelength of the light to which the second electrode layer 6 and the third electrode layer 7 should be transmissive depends on the absorption wavelength of the second pho- toelectric conversion layer 9. The second electrode layer 6 and the third electrode layer 7 have a thickness of, for example, greater than or equal to 1 nm and less than or equal to 1000 nm.

Second Electron Transport Layer 8

The second electron transport layer 8 transports electrons. The second electron transport layer 8 includes a semicon- ductor. It is desirable that the second electron transport layer 8 be formed of a semiconductor having a bandgap of greater than or equal to 3.0 eV. In instances where the second electron transport layer 8 is formed of a semiconductor having a bandgap of greater than or equal to 3.0 eV, visible light and infrared light can be transmitted therethrough to the second photoelectric conversion layer 9. Examples of the semiconductor include organic or inorganic n-type semicon- ductors.

Examples of the organic n-type semiconductors include imide compounds, quinone compounds, fullerenes, and derivatives of fullerenes. Examples of the inorganic n-type semiconductors include metal oxides, metal nitrides, and perovskite oxides. Examples of the metal oxides include oxides of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. Examples of the metal nitrides include GaN. Examples of the perov- skite oxides include $SrTiO_3$, $CaTiO_3$, and $ZnTiO_3$.

The second electron transport layer 8 may be formed of a material having a bandgap of greater than 6.0 eV. Examples of the material having a bandgap of greater than 6.0 eV include the following materials:

(i) halides of an alkali metal or an alkaline earth metal, such as lithium fluoride and barium fluoride; and (ii) oxides of an alkaline earth metal, such as magnesium oxide.

In this instance, the second electron transport layer 8 may have a thickness of, for example, less than or equal to 10 nm so that an electron transport property of the second electron transport layer 8 can be ensured.

The second electron transport layer 8 may include two or more layers, and the materials of the layers may be different from each other.

Second Photoelectric Conversion Layer 9

The second photoelectric conversion layer 9 includes the second perovskite compound. Specifically, the second pho- toelectric conversion layer 9 includes the second perovskite compound, which serves as a photoelectric conversion mate- rial and is formed of a monovalent cation, a divalent cation, and a halogen anion. The photoelectric conversion material is a light-absorbing material.

In the present embodiments, the second perovskite com- pound may be a compound represented by a chemical formula of $A2B2X2_3$, where A2 is a monovalent cation, B2 is a divalent cation, and X2 is a halogen anion.

In this specification, A2, B2, and X2 are also referred to as an "A2 site", a "B2 site", and an "X2 site", respectively, in accordance with expressions commonly used for perov- skite compounds.

In the present embodiments, the second perovskite com- pound may have a perovskite-type crystal structure repre- sented by the chemical formula of $A2B2X2_3$. For example, a monovalent cation is located at the A2 site, a divalent cation is located at the B2 site, and a halogen anion is located at the X2 site.

A2 Site

The monovalent cation located at the A2 site is not limited. Examples of the monovalent cation include organic cations and alkali metal cations. Examples of the organic cations include methyl ammonium cations (i.e., $CH_3NH_3^+$), formamidinium cations (i.e., $NH_2CHNH_2^+$), phenylethyl ammonium cations (i.e., $C_6H_5C_2H_4NH_3^+$), and guanidinium cations (i.e., $CH_6N_3^+$). Examples of the alkali metal cations include cesium cations (i.e., $Cs^+$).

For example, the A2 site may include at least one selected from the group consisting of $Cs^+$, formamidinium cations, and methyl ammonium cations so that high photoelectric conversion efficiency can be achieved.

The cation that forms the A2 site may be a mixture of a plurality of the above-mentioned organic cations. The cation that forms the A2 site may be a mixture of at least one of the above-mentioned organic cations and at least one of the metal cations.

B2 Site

The divalent cation located at the B2 site is not limited. Examples of the divalent cation include divalent cations of the elements of Groups 13 to 15. For example, the B2 site includes at least one selected from the group consisting of a Pb cation (i.e., $Pb^{2+}$) and a Sn cation (i.e., $Sn^{2+}$). For example, the B2 site includes a Pb cation and a Sn cation.

X2 Site

The halogen anion located at the X2 site is not limited.

The element, that is, the ion, located at each of the A2, B2, and X2 sites may be two or more types of ions or one type of ion.

Specific examples of the second perovskite compound include $CH_3NH_3PbI_3$, $CH_3CH_2NH_3PbI_3$, $CH_3NH_3SnI_3$, $CH_3CH_2NH_3SnI_3$, $CH_3NH_3Pb_{0.5}Sn_{0.5}I_3$, and $CH_3CH_2NH_3Pb_{0.5}Sn_{0.5}I_3$.

The second photoelectric conversion layer 9 may include a material other than a photoelectric conversion material. For example, the second photoelectric conversion layer 9 may further include a quencher substance for reducing a defect density of the second perovskite compound. The quencher substance is a fluorine compound, such as stan- nous fluoride. A molar ratio of the quencher substance to the photoelectric conversion material may be greater than or equal to 5% and less than or equal to 20%.

The second photoelectric conversion layer 9 may include impurities. The second photoelectric conversion layer 9 may further include a compound other than the second perovskite compound.

The second photoelectric conversion layer 9 may have a thickness of, for example, approximately greater than or equal to 100 nm and less than or equal to 2000 nm. The second perovskite compound that is included in the second photoelectric conversion layer 9 may be formed by using a coating process that uses a solution, a co-deposition process, or the like.

Furthermore, the second photoelectric conversion layer 9 may be in a form in which the second photoelectric con- version layer 9 partially coexists with the second electron transport layer 8 and the second hole transport layer 10, which will be described later, or in a form in which the second photoelectric conversion layer 9 has large-area inter- faces with the second electron transport layer 8 and the second hole transport layer 10 in the film.

Second Hole Transport Layer 10

The second hole transport layer 10 includes a hole trans- port material. The hole transport material is a material that transports holes. Examples of the hole transport material include organic matter and inorganic semiconductors.

Examples of typical organic matter and inorganic semi- conductors that can be included in the second hole transport layer 10 and used as a hole transport material are the same as those that can be included in the first hole transport layer 5 and used as a hole transport material.

The second hole transport layer 10 may include two or more layers, and the materials of the layers may be different from each other.

Desirably, the second hole transport layer 10 has a thickness of greater than or equal to 1 nm and less than or equal to 1000 nm. The thickness is more desirably greater than or equal to 10 nm and less than or equal to 500 nm and even more desirably greater than or equal to 10 nm and less than or equal to 50 nm. When the thickness of the second hole transport layer 10 is greater than or equal to 1 nm and less than or equal to 1000 nm, a sufficient hole transport property can be exhibited. In addition, when the thickness of the second hole transport layer 10 is greater than or equal to 1 nm and less than or equal to 1000 nm, the second hole transport layer 10 has a low resistance, which can result in highly efficient conversion of light to electricity.

The film can be formed by using any of various coating processes and printing processes known in the art. Examples of the coating processes include doctor blade processes, bar coating processes, spraying processes, dip coating processes, and spin coating processes. Examples of the printing processes include screen printing processes.

The second hole transport layer 10 may include a supporting electrolyte and a solvent. The supporting electrolyte and the solvent have an effect of stabilizing the holes in the second hole transport layer 10, for example.

Examples of the supporting electrolyte and the solvent that may be included in the second hole transport layer 10 are the same as the examples of the supporting electrolyte and the solvent that may be included in the first hole transport layer 5.

Fourth Electrode Layer 11

The fourth electrode layer 11 may or may not be light-transmissive.

In instances where the fourth electrode layer 11 is a light-transmissive electrode layer, light in a visible to near-infrared range can pass through the fourth electrode layer 11. The light-transmissive electrode layer may be formed of a material that is transparent and conductive.

Examples of the material include the following materials:
(i) titanium oxide doped with at least one selected from the group consisting of lithium, magnesium, niobium, and fluorine;
(ii) gallium oxide doped with at least one selected from the group consisting of tin and silicon;
(iii) gallium nitride doped with at least one selected from the group consisting of silicon and oxygen;
(iv) indium-tin complex oxides;
(v) tin oxide doped with at least one selected from the group consisting of antimony and fluorine;
(vi) zinc oxide doped with at least one of boron, aluminum, gallium, and indium; and
(vii) composites of any of these.

The light-transmissive electrode layer may be formed of a non-transparent material, for which a pattern through which light can pass may be provided. Examples of the pattern through which light can pass include linear patterns, wavy patterns, grid-like patterns, and perforated metal-like patterns having a large number of fine through-holes regularly or irregularly arranged therein. When the light-transmissive electrode layer has any of these patterns, light can pass through the portion in which the material of the electrode layer is absent. Examples of the non-transparent material include platinum, gold, silver, copper, aluminum, rhodium, indium, titanium, iron, nickel, tin, zinc, and alloys containing any of these. The non-transparent material may be a conductive carbon material.

Second Substrate 12

The second substrate 12 supports the layers of the bottom cell 102. The second substrate 12 may be formed of a transparent material, for example. For example, a glass substrate or a plastic substrate (which may be a plastic film) may be used. The second substrate 12 may be formed of a non-transparent material. In instances where the fourth electrode layer 11 has sufficient strength, the fourth electrode layer 11 can support the layers, and, therefore, in such instances, the fourth electrode layer 11 may double as the second substrate 12. In other words, a fourth electrode layer 11 that can also serve as the second substrate 12 may be used.

Different Layer

An example of the different layer is a porous layer. For example, the porous layer is located between the first electron transport layer 3 and the first photoelectric conversion layer 4. The porous layer includes a porous body. The porous body includes pores. The pores present in the porous layer located between the first electron transport layer 3 and the first photoelectric conversion layer 4 are interconnected throughout a region from a portion that is in contact with the first electron transport layer 3 to a portion that is in contact with the first photoelectric conversion layer 4. Typically, the pores are filled with the material that forms the first photoelectric conversion layer 4, and, therefore, electrons can migrate directly from the first photoelectric conversion layer 4 to the first electron transport layer 3.

The porous layer can serve as a base for forming the first photoelectric conversion layer 4 on the first electron transport layer 3. The porous layer does not hinder the light absorption that occurs in the first photoelectric conversion layer 4 or the migration of electrons from the first photoelectric conversion layer 4 to the first electron transport layer 3.

The porous body that can form the porous layer is formed of, for example, a series of particles of an insulator or a semiconductor. Examples of the insulating particles include aluminum oxide particles and silicon oxide particles. Examples of the semiconductor particles include inorganic semiconductor particles. Examples of the inorganic semiconductor include oxides of metal elements, perovskite oxides of metal elements, sulfides of metal elements, and metal chalcogenides. Examples of the oxides of metal elements include oxides of any of the following metal elements: Cd, Zn, In, Pb, Mo, W, Sb, Bi, Cu, Hg, Ti, Ag, Mn, Fe, V, Sn, Zr, Sr, Ga, Si, and Cr. A specific example of the oxides of metal elements is $TiO_2$. Examples of the perovskite oxides of metal elements include $SrTiO_3$ and $CaTiO_3$. Examples of the sulfides of metal elements include CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenides include CdSe, $In_2Se_3$, $WSe_2$, HgS, PbSe, and CdTe.

The porous layer may have a thickness of greater than or equal to 0.01 μm and less than or equal to 10 μm or greater than or equal to 0.1 μm and less than or equal to 1 μm. The porous layer may have a high surface roughness. Specifically, the porous layer may have a surface roughness factor of greater than or equal to 10 or greater than or equal to 100. The surface roughness factor is determined as the value of an effective area divided by a projected area. Note that the projected area is an area of a shadow formed behind an object when the object is illuminated with light from the front. The effective area is an actual surface area of the object. The effective area can be calculated from a volume of the object, which can be determined from the projected area and a thickness of the object, and a specific surface area and a bulk density of the material that forms the object.

Another example of the different layer is a buffer layer. The buffer layer is located between the second electrode layer 6 and the first hole transport layer 5 and/or between the third electrode layer 7 and the second electron transport layer 8. A purpose of providing the buffer layer is to inhibit damage to the first hole transport layer 5 or the second electron transport layer 8, which serves as an underlayer during the formation of the second electrode layer 6 or the third electrode layer 7. Accordingly, it is required that the buffer layer not hinder the transport of electrons or holes. Examples of materials that can form the buffer layer include inorganic semiconductors and compounds containing organic matter. Particular examples include transition-metal-containing oxides, such as molybdenum oxide and tungsten oxide.

Advantageous Effects of Solar Cells

In the solar cells of the first to fourth embodiments, the first substrate 1, the first electrode layer 2, the second electrode layer 6, and the third electrode layer 7 are light-transmissive. Light enters the solar cells through a surface on the first substrate 1-side (e.g., an upper side as viewed in FIG. 3). In the solar cells of the first to fourth embodiments, upon irradiation with light, the first photoelectric conversion layer 4 absorbs short-wavelength light, and the second photoelectric conversion layer 9 absorbs long-wavelength light. As a result, excited electrons and holes are generated in the solar cells. The electrons excited in the top cell 101 migrate to the first electrode layer 2 through the first electron transport layer 3. The holes excited in the top cell 101 migrate to the second electrode layer 6 through the first hole transport layer 5. The electrons excited in the bottom cell 102 migrate to the third electrode layer 7 through the second electron transport layer 8. The holes excited in the bottom cell 102 migrate to the fourth electrode layer 11 through the second hole transport layer 10.

In the instances of the solar cell 100 of the first embodiment and the solar cell 400 of the fourth embodiment, the first electron transport layer 3 is electrically connected to the first electrode layer 2; the second hole transport layer 10 is electrically connected to the fourth electrode layer 11; and the first electrode layer 2 and the fourth electrode layer 11 are electrically connected to each other. Accordingly, the electrons that have migrated from the first electron transport layer 3 to the first electrode layer 2 recombine with the holes that have migrated from the second hole transport layer 10 to the fourth electrode layer 11. The holes that have migrated from the first hole transport layer 5 to the second electrode layer 6 and the electrons that have migrated from the second electron transport layer 8 to the third electrode layer 7 are drawn from the second electrode layer 6 and the third electrode layer 7 to provide a current. The current drawn from the top cell 101 and the bottom cell 102 is drawn to an external circuit.

In the instance of the solar cell 200 of the second embodiment, the first hole transport layer 5 is electrically connected to the second electrode layer 6; the second electron transport layer 8 is electrically connected to the third electrode layer 7; and the second electrode layer 6 and the third electrode layer 7 are electrically connected to each other. Accordingly, the holes that have migrated from the first hole transport layer 5 to the second electrode layer 6 recombine with the electrons that have migrated from the second electron transport layer 8 to the third electrode layer 7. The electrons that have migrated from the first electron transport layer 3 to the first electrode layer 2 and the holes that have migrated from the second hole transport layer 10 to the fourth electrode layer 11 are drawn from the first electrode layer 2 and the fourth electrode layer 11 to provide a current. The current drawn from the top cell 101 and the bottom cell 102 is drawn to an external circuit.

In the instance of the solar cell 300 of the third embodiment, the first electron transport layer 3 is electrically connected to the first electrode layer 2; the first hole transport layer 5 is electrically connected to the second electrode layer 6; the second electron transport layer 8 is electrically connected to the third electrode layer 7; the second hole transport layer 10 is electrically connected to the fourth electrode layer 11; the first electrode layer 2 and the third electrode layer 7 are electrically connected to each other; and the second electrode layer 6 and the fourth electrode layer 11 are electrically connected to each other. Accordingly, the electrons that have migrated from the first electron transport layer 3 to the first electrode layer 2 and the electrons that have migrated from the second electron transport layer 8 to the third electrode layer 7 are drawn from the first wire 22. The holes that have migrated from the first hole transport layer 5 to the second electrode layer 6 and the holes that have migrated from the second hole transport layer 10 to the fourth electrode layer 11 are drawn from the second wire 23. That is, the electrons and holes excited in the top cell 101 and the bottom cell 102, which are electrically connected together in parallel, are drawn from the first wire 22 and the second wire 23 to provide a current to an external circuit.

Exemplary Method for Manufacturing Solar Cell

In the solar cells of the present embodiments, the top cell 101 can be formed as follows. The first electrode layer 2, the first electron transport layer 3, the first photoelectric conversion layer 4, the first hole transport layer 5, and the second electrode layer 6 are formed on the first substrate 1, with each of the layers being formed by using any of the following processes: coating processes, representative examples of which include spin coating, spray coating, die coating, ink jet coating, gravure coating, and flexographic coating; physical vapor deposition (PVD), representative examples of which include evaporation and sputtering; chemical vapor deposition (CVD) that uses, for example, heat, light, or plasma; and the like. Likewise, the bottom cell 102 can be formed as follows. The fourth electrode layer 11, the second hole transport layer 10, the second photoelectric conversion layer 9, the second electron transport layer 8, and the third electrode layer 7 are formed on the second substrate 12, with each of the layers being formed by using any of the following processes: coating processes, representative examples of which include spin coating, spray coating, die coating, ink jet coating, gravure coating, and flexographic coating; PVD, representative examples of which include evaporation and sputtering; CVD that uses, for example, heat, light, or plasma; and the like. Subsequently, the top cell 101 and the bottom cell 102 are integrated with each other with a spacer or a filler, for example. Thereafter, the top cell 101 and the bottom cell 102 are electrically connected to each other with a wire or the like. In this manner, the solar cells are formed.

The solar cells of the present disclosure are useful as various types of solar cells, examples of which include solar cells that are installed on a roof.

What is claimed is:

1. A method for manufacturing a solar cell, the method comprising:

forming a first cell, the forming of the first cell including:

forming, on a first substrate: a first electrode layer, a first electron transport layer, a first photoelectric conversion layer including a first perovskite compound, a first hole transport layer, and a second electrode layer, in the order stated;

forming a second cell, the forming of the second cell including:

forming, on a second substrate: a fourth electrode layer, a second hole transport layer, a second photoelectric conversion layer including a second perovskite compound, a second electron transport layer, and a third electrode layer, in the order stated;

disposing the first cell and the second cell such that the second electrode layer of the first cell and the third electrode layer of the second cell are disposed opposite to each other and are spaced apart from each other without direct contact;

joining a periphery of the first substrate and a periphery of the second substrate with a sealing member to fix relative positions of the first cell and the second cell and to maintain a space between the second electrode layer and the third electrode layer; and one of the following (i), (ii), or (iii):

(i) electrically connecting the first electrode layer of the first cell and the fourth electrode layer of the second cell to each other, (ii) electrically connecting the second electrode layer of the first cell and the third electrode layer of the second cell to each other, or (iii) electrically connecting the first electrode layer of the first cell and the third electrode layer of the second cell to each other, and electrically connecting the second electrode layer of the first cell and the fourth electrode layer of the second cell to each other; wherein the first perovskite compound has a bandgap greater than a bandgap of the second perovskite compound.

2. The method according to claim 1, wherein the first electron transport layer includes a metal oxide.

3. The method according to claim 2, wherein the metal oxide includes, as a major component, at least one selected from the group consisting of titanium oxide and tin oxide.

4. The method according to claim 1, further comprising:

forming a filler between the second electrode layer and the third electrode layer, the filler including at least one selected from the group consisting of epoxy resins, silicone resins, and polyolefin-based resins.

5. The method according to claim 1, wherein the method includes the electrically connecting of the first electrode layer of the first cell and the fourth electrode layer of the second cell to each other, where the first electrode layer and the fourth electrode layer are electrically connected to each other with a wire.

6. The method according to claim 1, wherein the method includes the electrically connecting of the second electrode layer of the first cell and the third electrode layer of the second cell to each other, where the second electrode layer and the third electrode layer are electrically connected to each other with a wire.

7. The method according to claim 1, wherein the method includes the electrically connecting of the first electrode layer of the first cell and the third electrode layer of the second cell to each other, and the electrically connecting the second electrode layer of the first cell and the fourth electrode layer of the second cell to each other, where the first electrode layer and the third electrode layer are electrically connected to each other with a wire, and the second electrode layer and the fourth electrode layer are electrically connected to each other with a wire.

8. The method according to claim 1, further comprising configuring the solar cell to have a two-terminal structure such that electricity is drawn to an external circuit via only two terminals.

9. The method according to claim 1, further comprising configuring the solar cell to have a two-terminal structure such that electricity is drawn to an external circuit via only the second electrode layer and the third electrode layer as two external terminals.

10. The method according to claim 1, further comprising configuring the solar cell to have a two-terminal structure such that electricity is drawn to an external circuit via only the first electrode layer and the fourth electrode layer as two external terminals.

11. The method according to claim 1, wherein the electrically connecting of the first electrode layer and the third electrode layer to each other includes electrically connecting the first electrode layer and the third electrode layer to each other to constitute a first terminal, the electrically connecting of the second electrode layer and the fourth electrode layer to each other includes electrically connecting the second electrode layer and the fourth electrode layer to each other to constitute a second terminal, and electricity is drawn to an external circuit via only the first terminal and the second terminal.

* * * * *